US012802725B2

(12) United States Patent
Tseng et al.

(10) Patent No.: US 12,802,725 B2
(45) Date of Patent: Nov. 17, 2026

(54) MEMORY DEVICE FOR PERFORMING IN-MEMORY-SEARCH AND OPERATING METHOD THEREOF

(71) Applicant: MACRONIX INTERNATIONAL CO., LTD., Hsinchu (TW)

(72) Inventors: Po-Hao Tseng, Taichung City (TW); Tian-Cih Bo, Zhubei City (TW); Feng-Min Lee, Hsinchu City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 472 days.

(21) Appl. No.: 18/167,108

(22) Filed: Feb. 10, 2023

(65) Prior Publication Data

US 2024/0274165 A1 Aug. 15, 2024

(51) Int. Cl.

*G11C 7/10* (2006.01)
*G11C 7/06* (2006.01)

(52) U.S. Cl.

CPC ............ *G11C 7/1069* (2013.01); *G11C 7/067* (2013.01)

(58) Field of Classification Search

CPC .............................. G11C 7/1069; G11C 7/067
USPC ................................................... 365/189.011
See application file for complete search history.

(56) References Cited

U.S. PATENT DOCUMENTS 11,410,727 B1 * 8/2022 Hoang ............... G11C 16/3404
2023/0036141 A1 * 2/2023 Tseng ..................... G11C 16/26

OTHER PUBLICATIONS

Tseng, et al.: "In-Memory-Searching Architecture Based on 3D-NAND Technology with Ultra-high Parallelism"; 978-1-7281-8888-1/20/$31.00 © 2020 IEEE; pp. 36.1.1-36.1.4.

Tseng, et al.: "In-Memory Approximate Computing Architecture Based on 3D-NAND Flash Memories"; 978-1-6654-9772-5/22/$31.00 © 2022 IEEE 2022 Symposium on VLSI Technology & Circuits Digest of Technical Papers; pp. 270-271.

* cited by examiner

*Primary Examiner* — Amir Zarabian

(74) *Attorney, Agent, or Firm* — McClure, Qualey & Rodack, LLP

(57) ABSTRACT

A memory device for performing in-memory-search. A search voltage corresponding to a search data is applied to the first signal lines. A plurality of second signal lines of the memory device generate output currents. The threshold voltage of each of the memory cells of the memory device corresponds to a stored data, the stored data is compared with the search data to obtain a comparison result. The output current reflects the comparison result. Values of the stored data and search data of the first memory cells are equal to values of the stored data and the search data of the second memory cells. The threshold voltage of the first memory cells is complementary to the threshold voltage of the second memory cells. The search voltage applied to the first memory cells is complementary to the search voltage applied to the second memory cells.

20 Claims, 9 Drawing Sheets

MEMORY DEVICE FOR PERFORMING IN-MEMORY-SEARCH AND OPERATING METHOD THEREOF

TECHNICAL FIELD

The present disclosure relates to a semiconductor device and its operating method, in particular, relates to a memory device and its operating method to perform in-memory-search.

BACKGROUND

Ternary content addressable memory (TCAM) may realize highly parallel searching, and may be applied to data-comparison and data-search of big data and artificial intelligence. In the prior art, an in-memory-search (IMS) based on a three-dimensional (3D) NAND Flash architecture may perform exact-matching to realize the function of the TCAM.

However, in the exact-matching mechanism, when the stored data does not match the search data, the output current of the memory string will be blocked, and the corresponding sensing amplifier cannot sense the output current. Therefore, it is difficult to determine the degree of mismatch for the stored data and the search data. That is, it is difficult to determine the number of mismatched bits (i.e., referred to as "mismatched-bits-number") between the stored data and the search data. In addition, the length of the search word (i.e., the number of bits of the search word) may also be limited.

Therefore, those skilled in the art have proposed an improved memory device architecture, using a reconfigured IMS architecture to perform binary search in 3D NAND flash. It can perform approximate-matching to determine the mismatched-bits-number, and can increase the length of the search word as the number of layers of the 3D NAND flash increases.

SUMMARY

According to an aspect of the present disclosure, a memory device for performing in-memory-search is disclosed. The memory device comprising a plurality of first signal lines, a plurality of second signal lines and a plurality of memory cells. Each of the first signal lines is used to input a search data, each of the first signal lines is applied with a search voltage, and the search voltage corresponds to the search data. Each of the second signal lines is used to generate an output current. The memory cells are coupled to the first signal lines and the second signal lines, each of the memory cells is used to store a stored data, a threshold voltage of each of the memory cells corresponds to the stored data, the stored data is compared with the search data to obtain a comparison result, and the output current is related to the comparison result. The memory cells include a plurality of first memory cells and a plurality of second memory cells, values of the stored data and the search data of the first memory cells are equal to values of the stored data and the search data of the second memory cells, the threshold voltage of the first memory cells is complementary to the threshold voltage of the second memory cells, and the search voltage applied to the first memory cells is complementary to the search voltage applied to the second memory cells.

According to another aspect of the present disclosure, an operating method of a memory device for performing in-memory-search is disclosed. The memory device comprises a plurality of first signal lines, a plurality of second signal lines and a plurality of memory cells, the memory cells are coupled to the first signal lines and the second signal lines, each of the memory cells is used to store a stored data, a threshold voltage of each of the memory cells corresponds to the stored data. The operating method comprising the following steps. Applying a search voltage through each of the first signal lines, the search voltage corresponds to a search data. Comparing the stored data with the search data through each of the memory cells to obtain a comparison result. Generating an output current through each of the second signal lines, the output current is related to the comparison result. Wherein, the memory cells include a plurality of first memory cells and a plurality of second memory cells, values of the stored data and the search data of the first memory cells are equal to values of the stored data and the search data of the second memory cells, the threshold voltage of the first memory cells is complementary to the threshold voltage of the second memory cells, and the search voltage applied to the first memory cells is complementary to the search voltage applied to the second memory cells.

Figure 1:
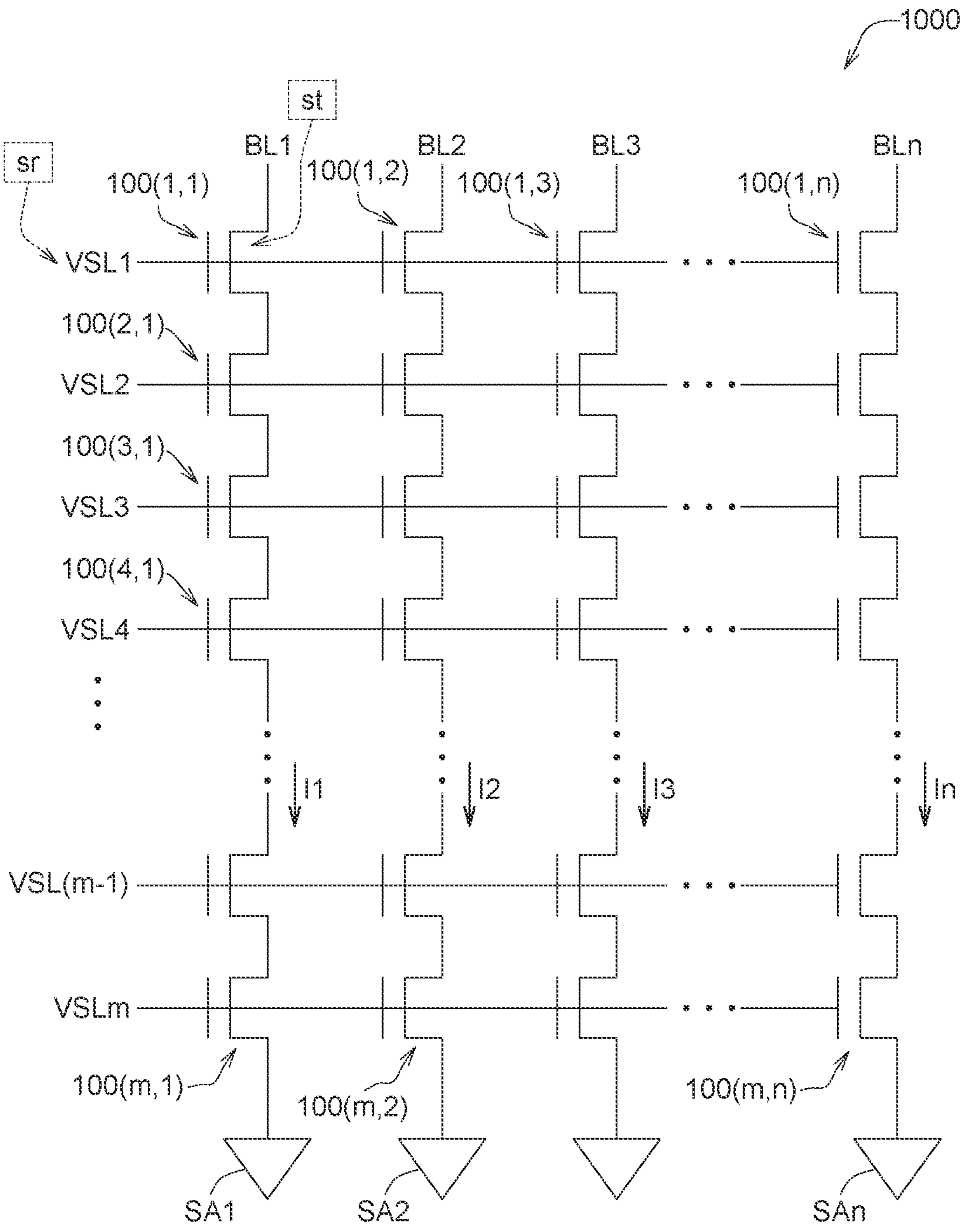
FIG. 1 is a schematic diagram of a memory device according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIG. 1 is a schematic diagram of a memory device 1000 according to an embodiment of the present disclosure. As shown in FIG. 1, the memory device 1000 includes a plurality of first signal lines VSL1~VSLm, a plurality of second signal lines BL1~BLn, a plurality of memory cells 100(1,1)~100(*m*,*n*) and a plurality of sensing amplifiers SA1~SAn.

The first signal lines VSL1-VSLm are, for example, word lines, and the second signal lines BL1-BLn are, for example, bit lines. The memory cells 100(1, 1)~100(*m*,*n*) are arranged in an array form. The respective gates of the memory cells 100(1,1), 100(1,2), 100(1,3), . . . , 100(1,n) arranged in the first horizontal column are coupled to a first one of the first signal line VSL1. The drains of the memory cells 100(1,1), 100(2,1), 100(3,1), . . . , 100(*m*, 1) arranged in the first vertical row are coupled to a first one of the second signal line BL1.

The first one of sensing amplifier SA1 is coupled to the source of the memory cell 100(*m*, 1) and coupled to the first one of second signal line BL1. The second one of sensing amplifier SA2 is coupled to the source of the memory cell 100(*m*,2) and coupled to the second one of the second signal line BL2. Similarly, the n-th sensing amplifier SAn is coupled to the source of the memory cell 100(*m*,*n*) and coupled to the n-th second signal line BLn.

Memory cells 100(1,1)~100(*m*,*n*) are, for example, single level cells (SLC), each of memory cells 100(1,1)~100(*m*,*n*) are used to store a bit of stored data st. Since the memory cells 100(1,1)~100(*m*,*n*) are single level cells, data reading errors are less likely to occur, hence the memory device 1000 of the present disclosure has better reliability.

The memory device 1000 is a three-dimensional (3D) NAND structure, and the structure of the memory device 1000 has m layers. The same one of the second signal line couples m memory cells, and one memory cell is disposed in one layer of the structure of the memory device 1000 and coupled to one of the first signal line. For example, the second signal line BL1 is coupled to m memory cells 100(1,1)~100(*m*, 1), and these memory cells 100(1, 1)~100 (*m*, 1) are respectively disposed in m layers and coupled to m lines of the first signal lines VSL1~VSLm.

Each of the first signal lines VSL1~VSLm is used to input one bit of search data sr. The search voltage is inputted through the first signal lines VSL1~VSLm, the search voltage is applied to a corresponding one of the memory cells 100(1,1)~100(*m*,*n*), and the search voltage corresponds to the search data sr. On the other hand, each of the memory cells 100(1,1)~100(*m*,*n*) has a threshold voltage corresponding to the stored data st.

The memory device 1000 compares the stored data st with the search data sr to obtain a comparison result, so as to perform "in-memory-search (IMS)". The output currents I1~In generated by the second signal lines BL1~BLn respectively, may reflect the comparison result of the stored data st and the search data sr.

The memory cells 100(1, 1)~100(*m*,*n*) of the memory device 1000 include a plurality of first memory cells 100 (1*a*,1) and a plurality of second memory cells 100(1*b*, 1) (not shown in the figure). The values of the stored data st and the search data sr corresponding to the first memory cell 100(1*a*, 1) of the memory device 1000 are equal to those of the second memory cells 100(1*b*, 1). However, the threshold voltage and the applied search voltage corresponding to the first memory cells 100(1*a*, 1) are complementary or inverse to those of the second memory cells 100(1*b*, 1).

Figure 2A:
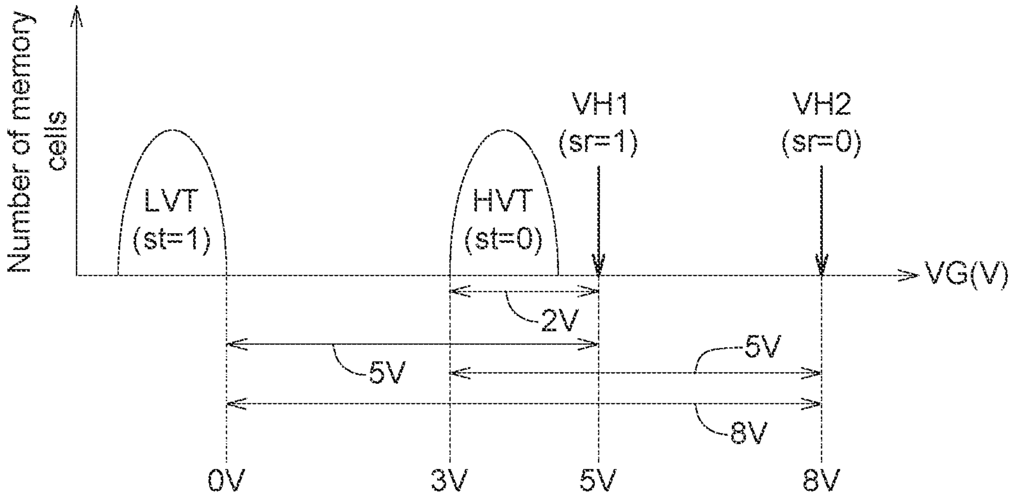
FIG. 2A is a schematic diagram of the threshold voltage distribution and the correspondingly inputted search voltage of the first memory cell.

FIG. 2A is a schematic diagram of the threshold voltage distribution and the correspondingly inputted search voltage of the first memory cell 100(1*a*, 1). As shown in FIG. 2A, the memory cell 100(1*a*, 1) is coupled to the first signal line VSL1*a*, and the threshold voltage distribution of the memory cell 100(1*a*, 1) may be changed through programming voltage. When the memory cell 100(1*a*, 1) has a first threshold voltage LVT with a low voltage value, the stored data st of the memory cell 100(1*a*, 1) is one bit of "1". When the memory cell 100(1*a*, 1) has the second threshold voltage HVT with a high voltage value, the stored data st of the memory cell 100(1*a*, 1) is one bit of "0". The first threshold voltage LVT is lower than the second threshold voltage HVT. The voltage value of the first threshold voltage LVT is lower than 0V, and the range of the voltage value of the second threshold voltage HVT is approximately 3V~4V.

On the other hand, the first search voltage VH1 or the second search voltage VH2 are inputted to the gate of the memory cell 100(1*a*, 1) through the first signal line VSL1*a*. The first search voltage VH1 is lower than the second search voltage VH2. The range of the voltage value of the first search voltage VH1 is approximately 3V~5V, and the range of the voltage value of the second search voltage VH2 is approximately 6V~9V. In the example shown in FIG. 2A, the voltage value of the first search voltage VH1 is, for example, 5V, and the voltage value of the second search voltage VH2 is, for example, 8V. The search data sr corresponding to the first search voltage VH1 is one bit of "1", and the search data sr corresponding to the second search voltage VH2 is one bit of "O".

The horizontal axis of FIG. 2A is the gate voltage VG of the memory cell 100(1*a*, 1). When the stored data st of the memory cell 100(1*a*, 1) is "0" and the search data sr is "1", the memory cell 100(1*a*, 1) has the second threshold voltage HVT, and the first signal line VSL1*a* is inputted with the first search voltage VH1 and then applied to the gate of the memory cell 100(1*a*, 1). According to the relationship between the gate voltage VG of the memory cell 100(1*a*, 1), the voltage difference between the first search voltage VH1 and the second threshold voltage HVT is approximately equal to 2V, that is, the gate overdrive voltage of the memory cell 100(1*a*, 1) is substantially equal to 2V.

On the other hand, when the stored data st of the memory cell 100 (1*a*, 1) is "0" and the search data sr is "0", the memory cell 100(1*a*,1) has the second threshold voltage HVT and receives the second search voltage VH2 through the first signal line VSL1*a*. The voltage difference between the second search voltage VH2 and the second threshold voltage HVT is substantially equal to 5V, and the gate overdrive voltage of the memory cell 100(1*a*,1) is substantially equal to 5V.

When the stored data st of the memory cell 100(1*a*, 1) is "1" and the search data sr is "1", the memory cell 100(1*a*, 1) has the first threshold voltage LVT and receives the first search voltage VH1 through the first signal line VSL1*a*. The voltage difference between the first search voltage VH1 and the first threshold voltage LVT is substantially equal to 5V, and the gate overdrive voltage of the memory cell 100(1*a*, 1) is substantially equal to 5V.

When the stored data st of the memory cell 100(1*a*, 1) is "1" and the search data sr is "0", the memory cell 100(1*a*, 1) has a first threshold voltage LVT and receives the second search voltage VH2 through the first signal line VSL1*a*. The voltage difference between the second search voltage VH2 and the first threshold voltage LVT is substantially equal to 8V, and the gate overdrive voltage of the memory cell 100(1*a*, 1) is substantially equal to 8V.

From the above, when the stored data st of the memory cell 100(1*a*, 1) is "O" and the search data sr is "1", the comparison result of IMS is "mismatch": the stored data st does not match the search data sr. The memory cell 100(1*a*,

1) has a lower gate overdrive voltage (substantially equal to 2V). When the stored data st and the search data sr are other values, the memory cell 100(1*a*, 1) has a higher gate overdrive voltage (substantially equal to 5V or 8V).

Figure 2B:
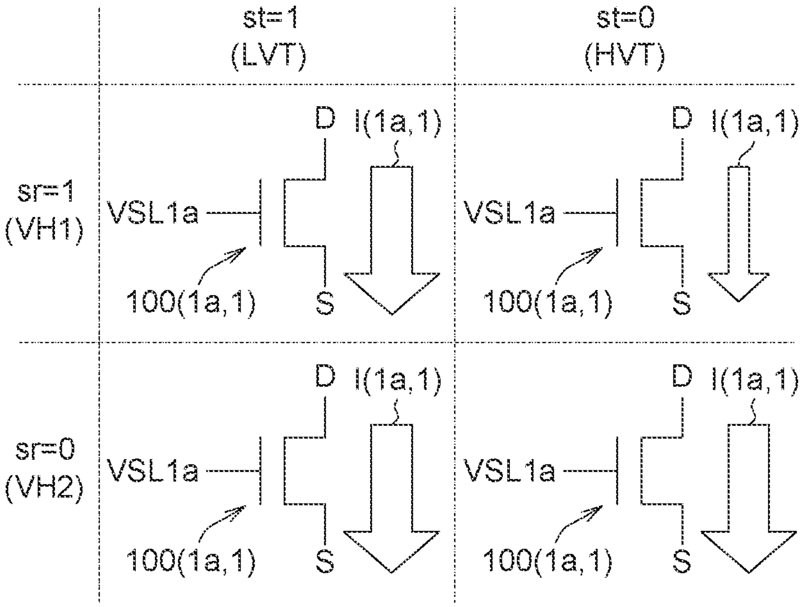
FIG. 2B is a schematic diagram of the output current generated by the first memory cell.

FIG. 2B is a schematic diagram of the output current I(1*a*, 1) generated by the first memory cell 100(1*a*, 1), which corresponds to different stored data st and search data sr in FIG. 2A. As shown in FIG. 2B, when the memory cell 100(1*a*, 1) stores different stored data st, and the first signal line VSL1*a* inputs different search data sr, the memory cell 100(1*a*, 1) correspondingly generates different values of output current I(1*a*, 1). The output current I(1*a*, 1) flows from the drain D to the source S of the memory cell 100(1*a*, 1).

When the stored data st of the memory cell 100(1*a*, 1) is "0" and the search data sr is "1", the comparison result of IMS is "mismatch": the stored data st does not match the search data sr. The memory cell 100(1*a*, 1) has a lower gate overdrive voltage (substantially equal to 2V), and the output current I(1*a*, 1) generated by the memory cell 100(1*a*, 1) has a first current value. The first current value is a low current value, for example, a current value range of 10 nA~90 nA.

On the other hand, when the stored data st and the search data sr are other values, (that is, the stored data st is "0" and the search data sr is "0", the stored data st is "1" and the search data sr is "1", or the stored data st is "1" and the search data sr is "0"), the memory cell 100(1*a*, 1) has a relatively high gate overdrive voltage (substantially equal to 5V or 8V), The output current I(1*a*, 1) generated by the memory cell 100(1*a*, 1) has a second current value. The second current value is a high current value, for example, a current value range of 100 nA~200 nA. The second current value is higher than the first current value.

From the above, the comparison result reflected by the output current I(1*a*, 1) having the first current value is: the search data sr of "1" does not match the stored data st of "0". Therefore, the memory cell 100(1*a*, 1) can obtain a comparison result that the search data sr of "1" does not match the stored data st of "0", according to the output current I(1*a*, 1) of the first current value.

Figure 3A:
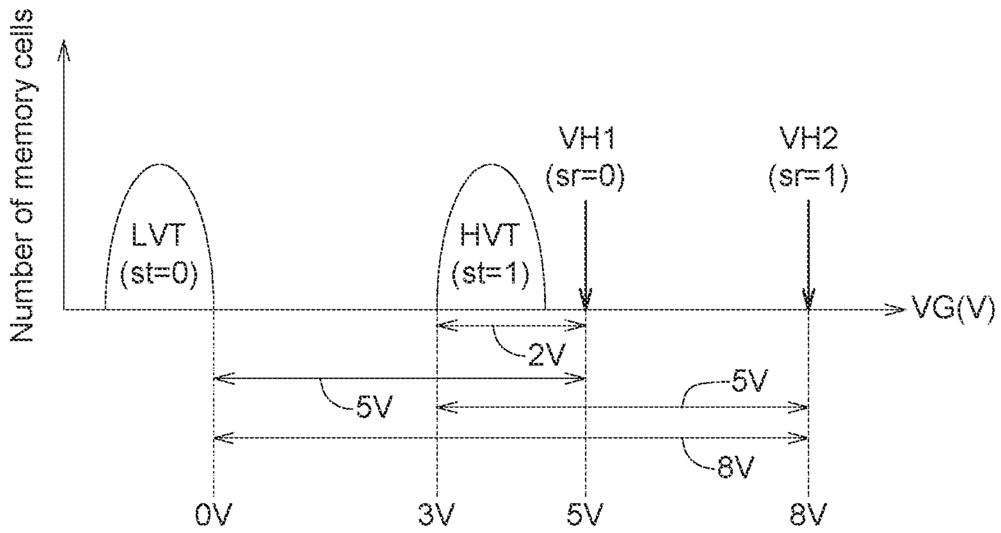
FIG. 3A is a schematic diagram of the threshold voltage distribution and the correspondingly inputted search voltage of the second memory cell.

FIG. 3A is a schematic diagram of the threshold voltage distribution and the correspondingly inputted search voltage of the second memory cell 100(1*b*, 1). As shown in FIG. 3A, the memory cell 100(1*b*, 1) is coupled to the first signal line VSL1*b*. For the same stored data st and the same search data sr, the threshold voltage and the applied search voltage corresponding to the second memory cells 100(1*b*,1) are complementary (or inversed) to those of the first memory cells 100(1*a*, 1).

The first threshold voltage LVT with a low voltage value of the second memory cell 100(1*b*, 1) corresponds to the stored data st of "0", and the second threshold voltage HVT with a high voltage value corresponds to the stored data st of "1". The first search voltage VH1 with a low voltage value inputted through the first signal line VSL1*b* corresponds to the search data sr of "0", and the second search voltage VH2 with a high voltage value corresponds to the search data sr of "1".

For the second memory cell 100(1*b*, 1), when the stored data st is "1" and the search data sr is "0", the memory cell 100(1*b*, 1) has a second threshold voltage HVT and receives the first search voltage VH1 from the first signal line VSL1*b*. According to the relationship of the gate voltage VG of the memory cell 100(1*b*, 1), the voltage difference between the first search voltage VH1 and the second threshold voltage HVT is substantially equal to 2V, that is, the gate overdrive voltage of the memory cell 100(1*b*, 1) is substantially equal to 2V.

On the other hand, when the stored data st and the search data sr of the memory cell 100(1*b*, 1) are other values, (that is, the stored data st is "0" and the search data sr is "0", the storage The data st is "1" and the search data sr is "1", or the stored data st is "0" and the search data sr is "1"), the voltage difference between the search voltage and the threshold voltage is substantially equal to 5V or 8V, and the memory cell 100(1*b*,1) has a relatively high gate overdrive voltage (substantially equal to 5V or 8V).

Figure 3B:
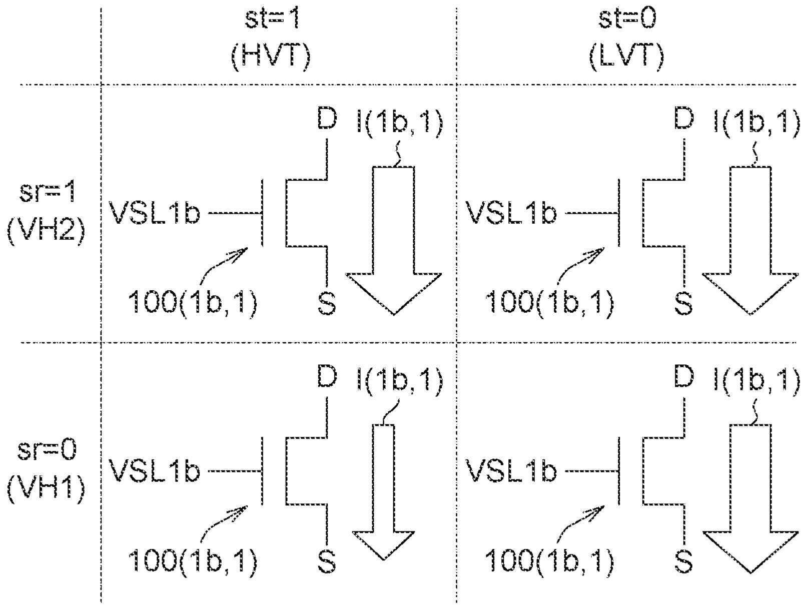
FIG. 3B is a schematic diagram of the output current generated by the second memory cell.

FIG. 3B is a schematic diagram of the output current I(1*b*, 1) generated by the second memory cell 100(1*b*, 1), which corresponds to different stored data st and search data sr in FIG. 3A. As shown in FIG. 3B, when the second memory cell 100(1*b*, 1) has the stored data st of "1" and the search data sr of "0", the memory cell 100(1*b*,1) has a lower gate overdrive voltage (substantially equal to 2V), the output current l(1*b*, 1) generated by the memory cell 100(1*b*,1) has a first current value.

On the other hand, when the stored data st and the search data sr of the memory cell 100(1*b*, 1) are other values, (that is, the stored data st is "0" and the search data sr is "0", the storage data st is "1" and the search data sr is "1", or the stored data st is "0" and the search data sr is "1"), the memory cell 100(1*b*, 1) has a higher gate overdrive voltage (substantially equal to 5V or 8V), the output current I(1*b*, 1) generated by the memory cell 100(1*b*, 1) has a higher second current value.

From the above, the output current I(1*b*, 1) having the first current value reflects the comparison result that the search data sr of "0" does not match the stored data st of "1". In contrast, the memory cells 100(1*a*, 1) shown in FIGS. 2A and 2B have complementary (or inversed) threshold voltages and search voltages, hence the memory cells 100(1*a*, 1) can obtain a comparison result: the search data sr of "1" does not match the stored data st of "0".

Figure 4A:
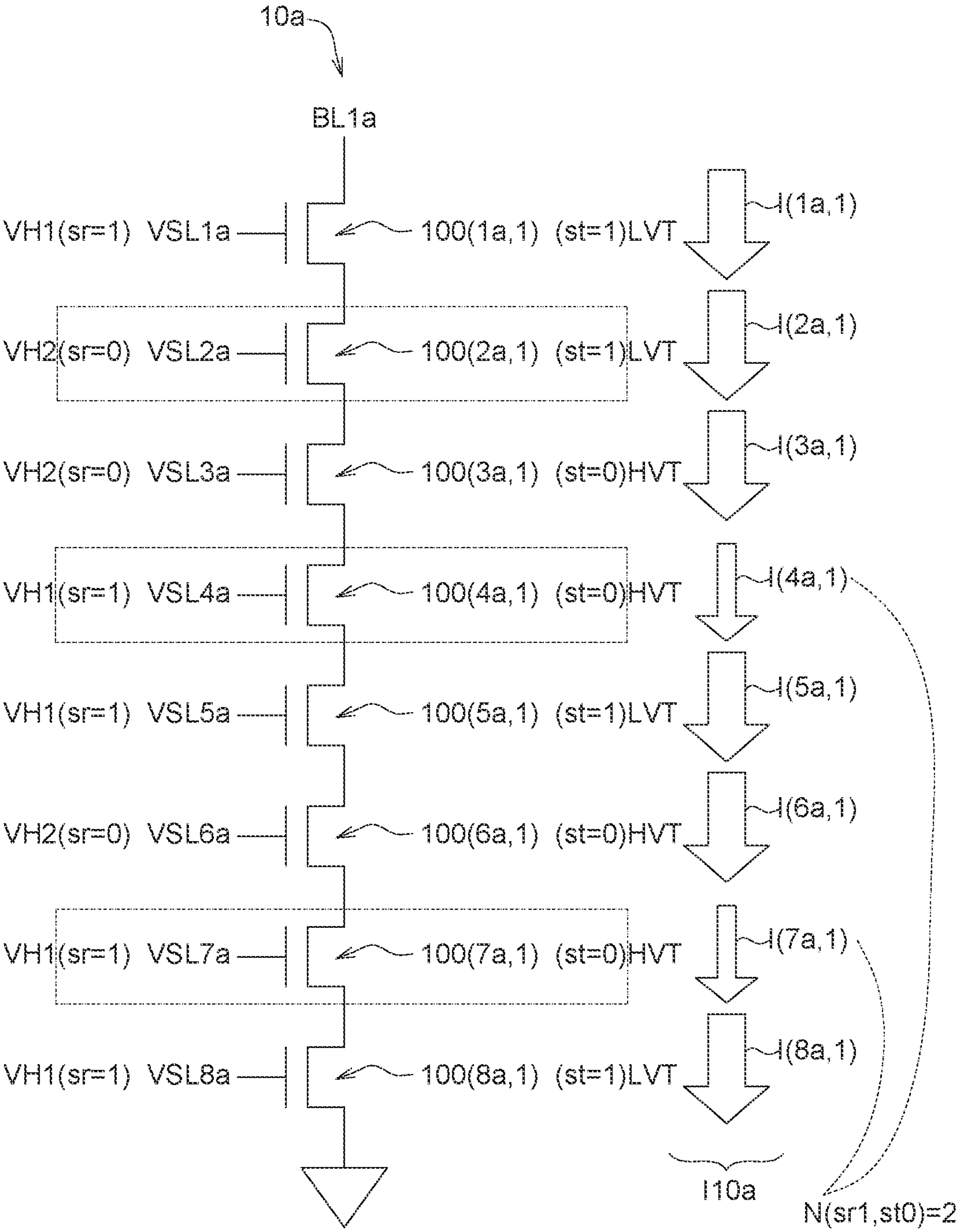
FIG. 4A is a schematic diagram of comparing the search data with the stored data performed by the memory string of the memory device.

FIG. 4A is a schematic diagram of comparing the search data sr with the stored data st performed by the memory string 10*a* of the memory device 1000. The memory string 10*a* is composed of 8 memory cells 100(1*a*, 1)~100(8*a*, 1), including the memory cell 100(1*a*,1) in FIG. 2B. The memory string 10*a* is coupled to the second signal line BL1*a*. The string output current I10*a* generated by the memory string 10*a* is the sum of the respective output currents I(1*a*,1)~1(8*a*,1) of the memory cells 100(1*a*, 1)~100(8*a*,1).

The memory cells 100(1*a*, 1), 100(4*a*, 1), 1005*a*, 1), 100(7*a*, 1) and 100(8*a*, 1) respectively receive the first search voltage VH1 through the first signal lines VSL1*a*, VSL4*a*, VSL5*a*, VSL7*a* and VSL8*a*, so as to input the search data sr of "1". On the other hand, the memory cells 100(2*a*, 1), 100(3*a*, 1) and 100(6*a*, 1) respectively receive the second search voltage VH2 through the first signal lines VSL2*a*, VSL3*a* and VSL6*a*, and the corresponding search data sr is "0".

Moreover, the memory cells 100(1*a*, 1), 100(2*a*, 1), 100(5*a*, 1) and 100(8*a*, 1) all have a first threshold voltage LVT, corresponding to the stored data st of "1". On the other hand, the memory cells 100(3*a*, 1), 100(4*a*, 1), 100(6*a*, 1) and 100(7*a*, 1) all have the second threshold voltage HVT, corresponding to the stored data st of "0".

From the above, the memory cells 100(2*a*, 1), 100(4*a*, 1) and 100(7*a*, 1) have a situation where the search data does not match the stored data. Wherein, the mismatch condition of the memory cells 100(4*a*, 1) and 100(7*a*, 1) is that: the search data sr of "1" does not match the stored data st of "0". Therefore, the output currents I(4*a*, 1) and I(7*a*,1) of the memory cells 100(4*a*,1) and 100(7*a*, 1) have a first current value. According to the string output current I10*a* produced by the memory string 10*a*, it can be analyzed that, the output currents of two memory cells in the memory string 10*a* have the first current value. Hence, it can be determined that, the comparison result of the memory string 10*a* is: the number of mismatch conditions (where the search data sr of "1" does not match the stored data st of "0") is 2.

Taking the expression "N(sr1, st0)" to indicate: the number for the comparison result being "mismatch" (referred to as "mismatch-number") wherein the search data sr of "1" does not match the stored data st of "0". The mismatch-number N(sr1,st0) in the memory string 10*a* is equal to 2.

Figure 4B:
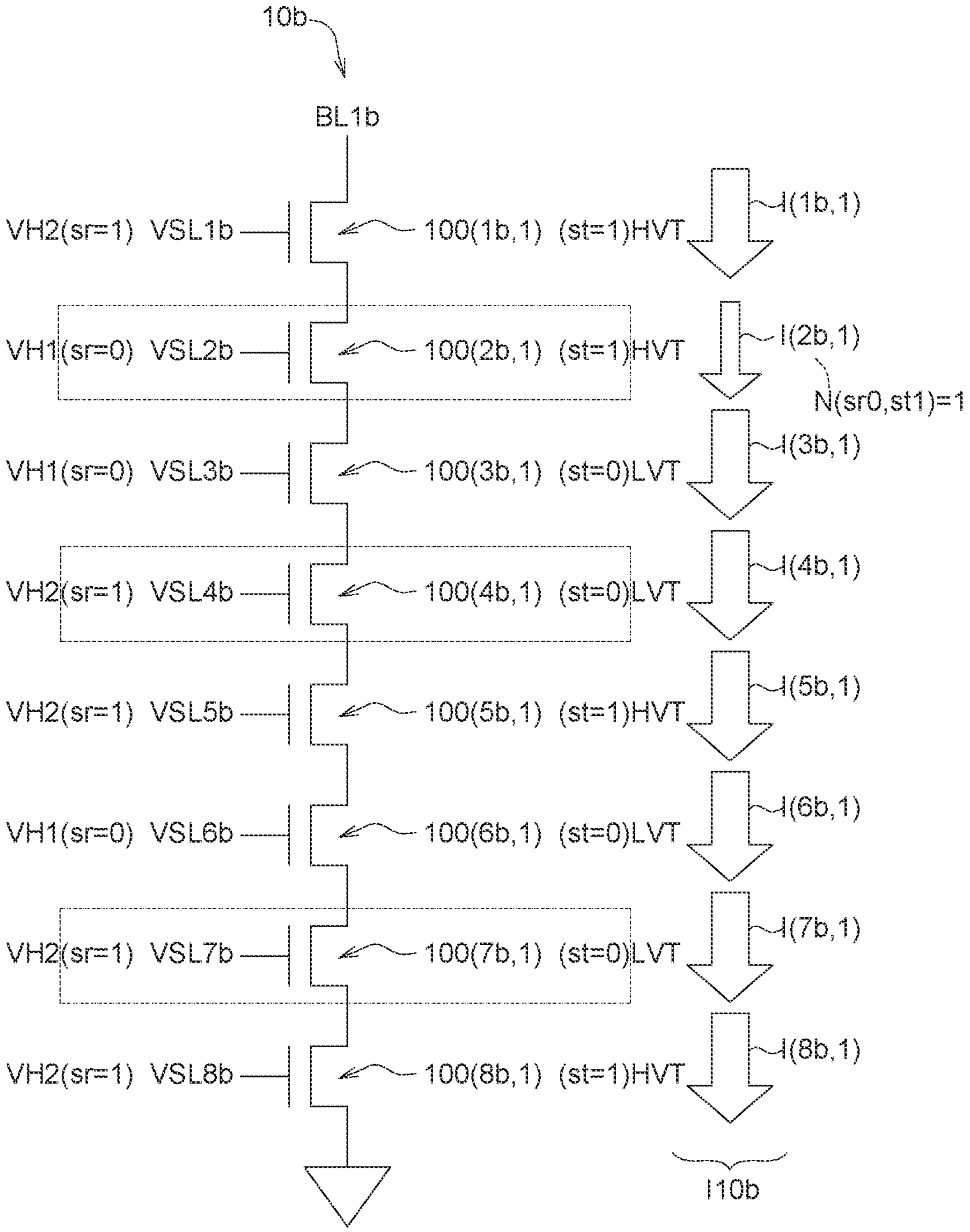
FIG. 4B is a schematic diagram of comparing the search data with the stored data performed by another memory string of the memory device.

FIG. 4B is a schematic diagram of comparing the search data sr with the stored data st performed by another memory string 10*b* of the memory device 1000. The memory string 10*b* is composed of 8 memory cells 100(1*b*, 1)~100(8*b*, 1), including the memory cell 100(1*b*, 1) in FIG. 3B. The memory string 10*b* is coupled to the second signal line BL1*b*. The string output current I10*b* generated by the memory string 10*b* is the sum of the respective output currents I(1*b*, 1)~I(8*b*,1) of the memory cells 100(1*b*, 1)~100 (8*b*,1).

The values of search data sr and stored data st of memory cells 100(1*b*, 1)~100(8*b*, 1) in FIG. 4B are the same as those of memory cells 100(1*a*, 1)~100(8*a*, 1) in FIG. 4A. However, the search voltage and threshold voltage of the memory cells 100(1*b*, 1)~100(8*b*, 1) in FIG. 4B are complementary (or inversed) to those of the memory cells 100(1*a*, 1)~100 (8*a*, 1).

In the memory string 10*b* in FIG. 4B, the search data does not match the stored data in the memory cells 100(2*b*, 1), 100(4*b*, 1) and 100(7*b*, 1). Wherein, the mismatch condition of the memory cell 100 (2*b*, 1) is that: the search data sr of "0" does not match the stored data st of "1". Therefore, the output current I(2*b*,1) of the memory cell 100(2*b*,1) has a first current value. According to the string output current I10*b* produced by the memory string 10*b*, it can be analyzed that the output current of one memory cell in the memory string 10*b* has the first current value, and it can be determined that, in the memory string 10*b* the mismatch-number is equal to 1, for the search data sr of "0" does not match the stored data st of "1".

Taking the expression "N(sr0,st1)" to indicate: the mismatch-number for the search data sr of "0" does not match the stored data st of "1". The mismatch-number N(sr0,st1) is equal to 1 in the memory string 10*b*.

A total current I10*t* is obtained by summing the string output current I10*a* of the memory string 10*a* in FIG. 4A and the string output current I10*b* of the memory string 10*b* in FIG. 4B. All of comparison results of "mismatch" can be analyzed according to the total current I10*t*, and these comparison results of "mismatch" include: the search data sr of "0" does not match the stored data st of "1", and, the search data sr of "1" does not match the stored data st of "0". The higher the current value of the total current I10*t*, the higher the "matching degree" between the search data sr and the stored data st, and the lower the mismatch-number N(sr1, st0) and mismatch-number N(sr0,st1). The total current I10*t* is inversely related to the sum of mismatch-number N(sr1, st0) and mismatch-number N(sr0,st1), as shown in formula (1):

$$\{N(sr1, st0) + N(sr0, st1)\} \propto 1/I10t \tag{1}$$

Moreover, a search word sr_w and a stored word st_w of the memory string 10*a* and the memory string 10*b* can be defined. Wherein, the search word sr_w is composed of the search data sr of the memory cells 100(1*a*, 1)~100(8*a*, 1), that is, the search word sr_w is "10011011" of eight bits. On the other hand, the stored word st_w is composed of the stored data sr of the memory cells 100(1*a*, 1)~100(8*a*, 1), that is, the stored word st_w is "11001001" of eight bits.

A Hamming distance HD between the search word sr_w and the stored word st_w can reflect the degree of matching (i.e., "matching degree") between the search word sr_w and the stored word st_w. The smaller the Hamming distance HD, the higher the matching degree between the search word sr_w and the stored word st_w. Therefore, the Hamming distance HD between the search word sr_w and the stored word st_w is positively related to the sum of the mismatch-number N(sr1, st0) and the mismatch-number N(sr0,st1), as shown in formula (2):

$$\{N(sr1, st0) + N(sr0, st1)\} \propto HD \tag{2}$$

In summary, when the memory device 1000 of the present disclosure compares the search data sr with the stored data st, even if the search data sr does not match the stored data st, the memory cell can still generate the output current (at this time, the output current has the first current flow), rather than completely blocking the output current. Therefore, the comparison of the search data sr and the stored data st by the memory device 1000 of the disclosure can be referred to as "approximate-matching".

Figure 5A:
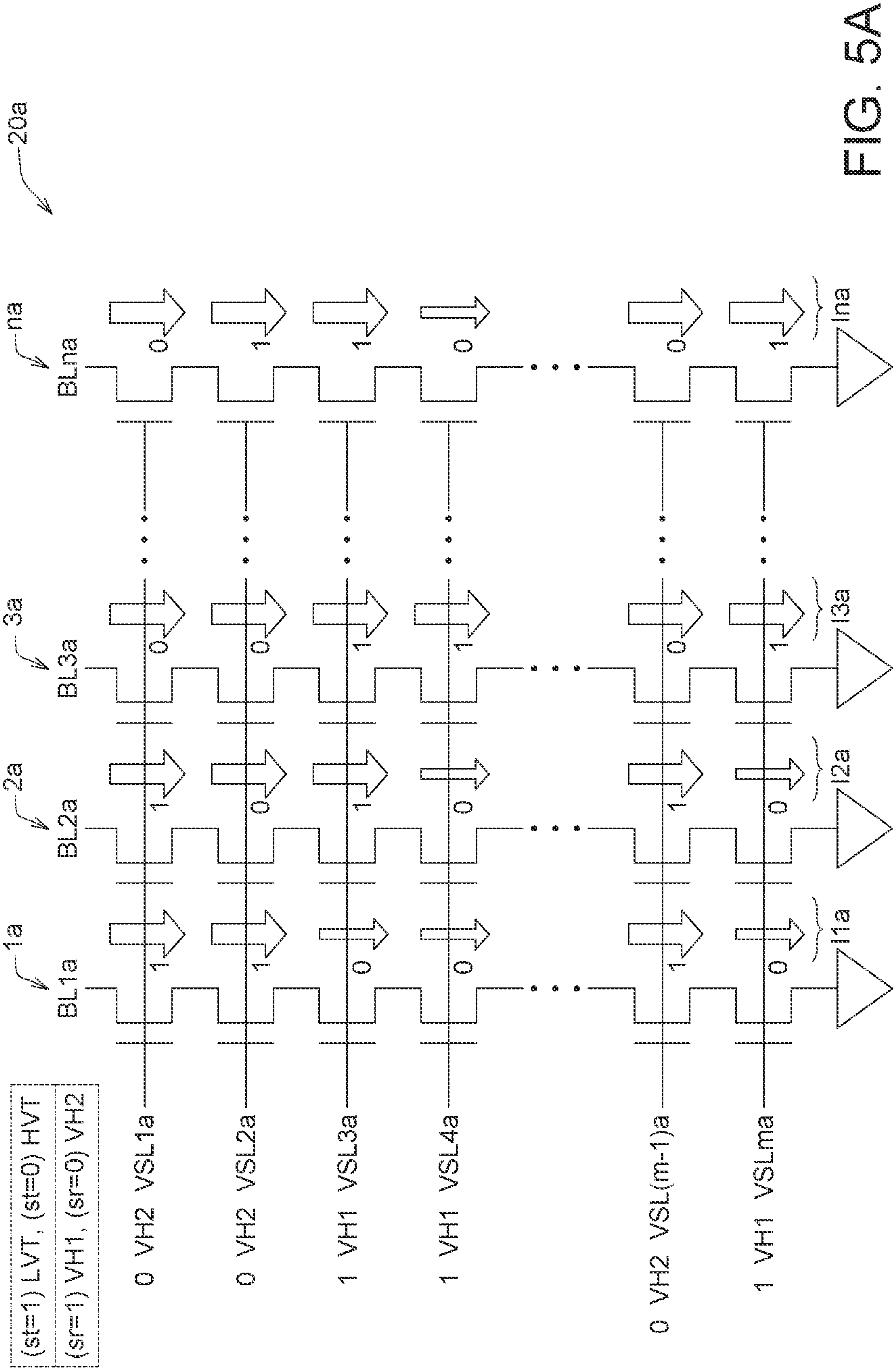
FIG. 5A is a schematic diagram of comparing the search data with the stored data performed by the memory block of the memory device.

FIG. 5A is a schematic diagram of comparing the search data sr with the stored data st performed by the memory block 20*a* of the memory device 1000. The memory block 20*a* is used to obtain a comparison result of "mismatch" that: the search data sr of "1" does not match the stored data st of "0".

As shown in FIG. 5A, the memory block 20*a* is composed of a plurality of memory strings 1*a*, 2*a*, 3*a*, . . . , na. Each of the memory strings 1*a*, 2*a*, 3*a*, . . . , na is similar to the memory string 10*a* of FIG. 4A. When the memory cells of the memory word strings 1*a*, 2*a*, 3*a*, . . . , na have the first threshold voltage LVT, the corresponding stored data st is "1", and when the memory cells have the second threshold voltage HVT, the corresponding stored data st is "0".

Each of the memory strings 1*a*, 2*a*, 3*a*, . . . , na receives the first search voltage VH1 or the second search voltage VH2 via a plurality of first signal lines VSL1*a*, VSL2*a*, VSL3*a*, . . . , VSLma. The first search voltage VH1 corresponding to the search data sr of "1", and the second search voltage VH2 corresponding to the search data sr of "0".

The memory string 1*a* stores a stored word st_w of m bits. The stored data st of the 3rd bit, the 4th bit and the m-th bit of the stored word st_w of the memory string 1*a* do not match the search data sr inputted by the first signal lines VSL3*a*, VSL4*a* and VSLma. Therefore, in the memory word string 1*a*, the output currents generated by the memory cells of the 3rd bit, the 4th bit and the m-th bit have a first current value. And, according to the degree of reduction of the current value of the string output current I1*a* generated by the memory string 1*a*, it can be analyzed that: in the memory string 1*a*, the mismatch-number N(sr1, st0) is equal to 3 for the search data sr of “1” not matching the stored data st of “0”.

Similarly, the stored data st of the 4th bit and the m-th bit of the stored word st_w of the memory string 2*a* do not match the search data sr inputted by the first signal lines VSL4*a* and VSLma. Therefore, in the memory word string 2*a*, the output current generated by the memory cell corresponding to the 4th bit and the m-th bit has a first current value. According to the current value of the string output current I2*a* generated by the memory string 2*a*, it is found that the mismatch-number N(sr1, st0) of the memory string 2*a* is equal to 2.

Figure 5B:
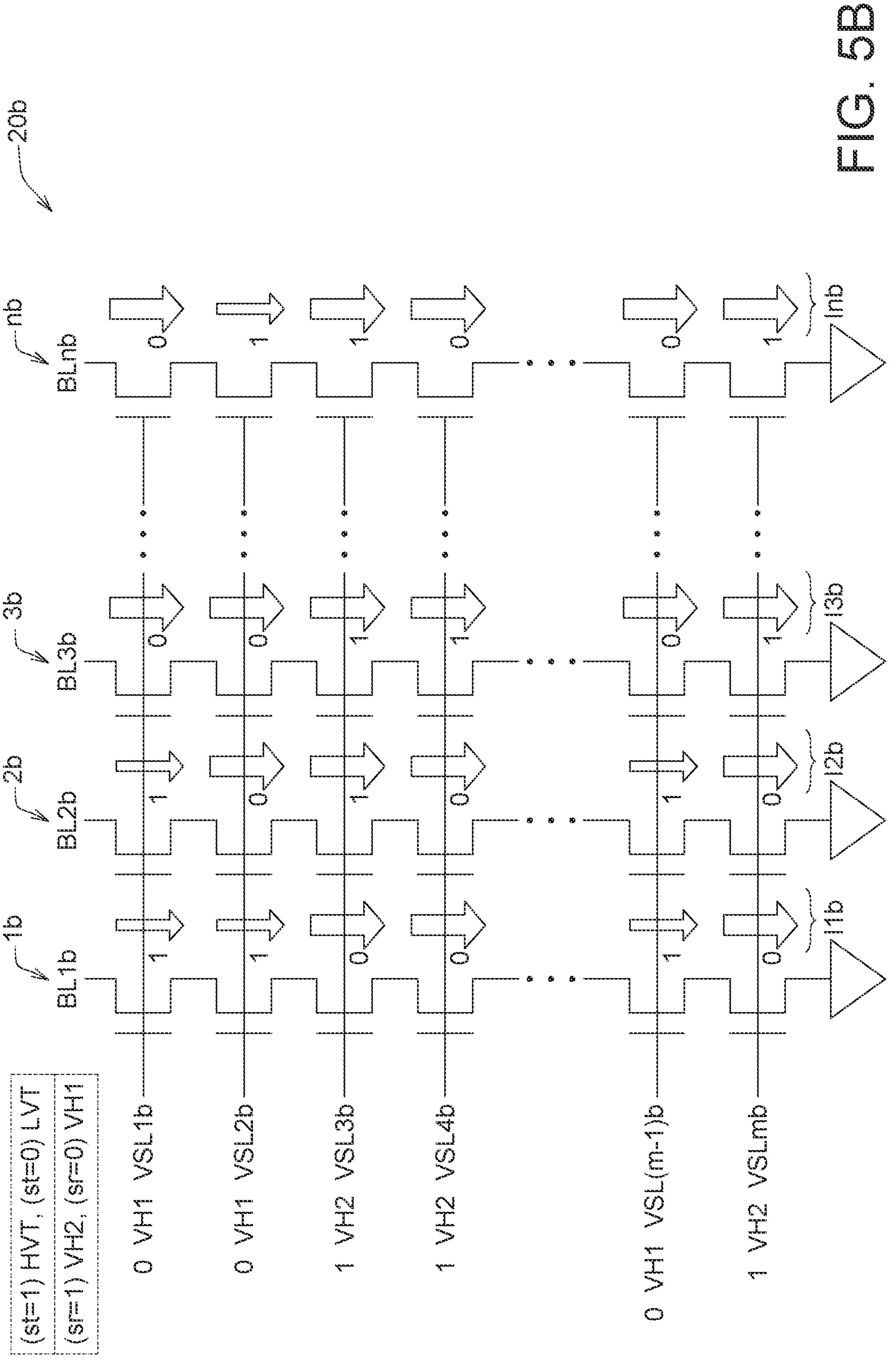
FIG. 5B is a schematic diagram of comparing the search data with the stored data performed by another memory block of the memory device.

FIG. 5B is a schematic diagram of comparing the search data sr with the stored data st performed by another memory block 20*b* of the memory device 1000. The memory block 20*b* is used to obtain a comparison result of “mismatch” that: the search data sr of “0” does not match the stored data st of “1”.

Each of the memory strings 1*b*, 2*b*, 3*b*, . . . , nb included in the memory block 20*b* in FIG. 5B is similar to the memory string 10*b* in FIG. 4B. The value of the stored data st stored in the memory cells of the memory strings 1*a*, 2*a*, 3*a*, . . . , na of the memory block 20*b* is the same as those stored in the memory block 20*a* of FIG. 5A. Moreover, the value of the search data sr inputted to the memory block 20*b* via the first signal lines VSL1*b*, VSL2*b*, VSL3*b*, . . . , VSLmb is also the same as that received by the memory block 20*a* in FIG. 5A. However, the threshold voltage and the search voltage of the memory cells of the memory block 20*b* in FIG. 5B are complementary (or inversed) to those of the memory block 20*a* in FIG. 5A. When the memory cells of the memory block 20*b* have the first threshold voltage LVT, the stored data st is “0”, and when the memory cells of the memory block 20*b* have the second threshold voltage HVT, the stored data st is “1”. The first search voltage VH1 received by the memory cells of the memory block 20*b* corresponds to the search data sr of “0”, and the second search voltage VH2 corresponds to the search data sr of “1”.

When the memory block 20*b* compares the search data sr with the stored data st, the stored data st of the 1st bit, the 2nd bit and the (m-1)-th bit in the stored word st_w of the memory string 1*b* do not match the search data sr inputted by the first signal lines VSL1*b*, VSL2*b* and VSL(m-1)b. Therefore, in the memory string 1*b*, the output currents generated by the memory cells corresponding to the 1st bit, the 2nd bit and the (m-1)-th bit have a first current value. And, according to the current value of the string output current I1*b* generated by the memory string 1*b*, it is analyzed that: the mismatch-number N(sr0,st1) of the memory string 1*b* is equal to 3. That is, the “mismatch” comparison result is: the search data sr of “0” does not match the stored data st of “1”, and the mismatch-number N(sr0,st1) is 3.

Similarly, the stored data st of the first bit and the (m-1)-th bit of the stored word st_w of another memory string 2*b* do not match the search data sr inputted via the first signal line VSL1*b* and VSL (m-1)b. According to the current value of the string output current I2*b* generated by the memory string 2*b*, it is found that the mismatch-number N(sr0, st1) of the memory string 2*b* is equal to 2, and so forth.

To sum up, the memory block 20*a* in FIG. 5A is used to obtain the “mismatch” comparison result that: the search data sr of “1” does not match the stored data st of “0”, and the memory block 20*b* in FIG. 5B is to obtain the “mismatch” comparison result that: the search data sr of “0” does not match the stored data st of “1”.

Furthermore, summing the string output current of the memory string of the memory block 20*a* to the string output current of the memory string of the memory block 20*b*, it can analyze all “mismatch” comparison results, including: search data sr of “1” does not match stored data st of “0”, and, search data sr of “0” does not match stored data st of “1”. For example, the string output current I1*a* of the memory word string 1*a* is summed to the string output current I1*b* of the memory word string 1*b*. The Hamming distance HD between the search word sr_w and the stored word st_w of the memory string 1*a* and the memory string 1*b* is inversely related to the sum of the string output current I1*a* and the string output current I1*b*.

Similarly, summing the string output current I2*a* of another memory string 2*a* to the string output current I2*b* of the memory string 2*b*. The Hamming distance HD between the search word sr_w and the stored word st_w of the memory string 2*a* and the memory string 2*b* is inversely related to the sum of the string output current I2*a* and the string output current I2*b*.

The threshold voltage and search voltage of the memory block 20*a* are complementary (or inversed) to the memory block 20*b*. By integrating the output currents of the memory block 20*a* and the memory block 20*b*, all “mismatch” comparison results (including: the search data sr of “1” does not match the stored data st of “0”, and, the search data sr of “0” does not match the stored data st of “1”) can be found. Therefore, one memory cell of the memory device 1000 of the present disclosure can process the comparison for one bit of search data sr and stored data st. From the above, when the memory device 1000 has a 3D-NAND structure and has m layers, the number of bits of the search word sr_w (i.e., the length of the search word sr_w) that the memory device 1000 can process, is equal to the number of layers “m” of the memory device 1000. For example, when the number of layers of the memory device 1000 is 48 (i.e., m=48), the number of bits of the search word sr_w that can be processed is 48. When the number of layers of the memory device 1000 is 96, 192 or 232 (i.e., m=96, 192 or 232), the number of bits of the search word sr_w that can be processed are 96, 192 or 232 respectively.

In another comparative example (not shown), the memory cells are not divided into two groups (e.g., first memory cells and second memory cells) to respectively process complementary (or inversed) threshold voltages and search voltages. In this comparative example, two memory cells are disposed in a same memory unit, and the comparison between the search data sr and the stored data st of one bit is processed by these two memory cells. Therefore, when the number of layers of the memory device of this comparative example is m, the length of the search word sr_w that can be processed is m/2.

Compared with the above comparative example, the length of the search word sr_w that can be processed by the memory device 1000 of the present disclosure is twice (i.e., the length of the search word sr_w is m, that can be processed by the memory device 1000 of the present disclosure).

Figure 6:
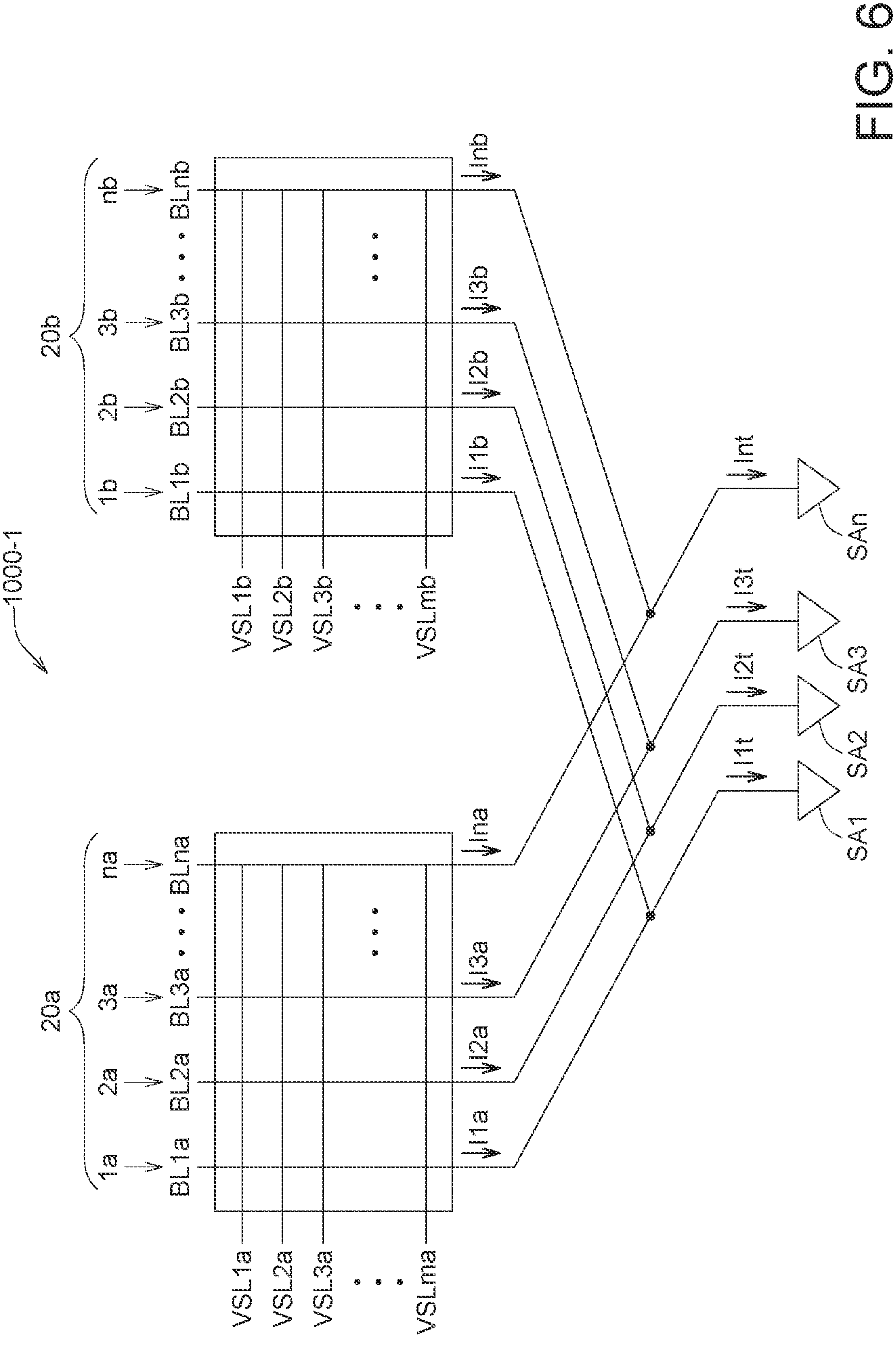
FIG. 6 is a schematic diagram of a memory device according to another embodiment of the present disclosure.

FIG. 6 is a schematic diagram of a memory device 1000-1 according to another embodiment of the present disclosure. In the memory device 1000-1 of this embodiment, the comparison result of IMS is analyzed based on the string output current of the memory block 20*a* and the memory block 20*b*, in a manner of “analog sensing”. As shown in FIG. 6, the string output current I1*a* of the memory string 1*a* of the memory block 20*a* is summed with the string output current I1*b* of the memory string 1*b* of the other memory block 20*b*, so as to obtain the total current I1*t*. Then, the total current I1*t* is sent to the sensing amplifier SA1. That is, before being transmitted to the sensing amplifier SA1, the string output current I1*a* is summed to the string output current I1*b* in an analogous manner. The sensing amplifier SA1 is used for sensing the total current I1*t*, and generates an output signal according to the current value of the total current I1*t*. According to the output signal of the sensing amplifier SA1, the comparison result of IMS for the memory string 1*a* and the memory string 1*b* is analyzed.

When the output signal of the sensing amplifier SA1 reflects that the total current I1*t* has a high current value, it indicates that the stored word st_w stored in the memory string 1*a* and the memory string 1*b* has a high matching degree with the search word sr_w, and the Hamming distance HD between the stored word st_w and the search word sr_w is smaller. That is, for the memory string 1*a* and the memory string 1*b*, the mismatch-number N(sr1, st0) for which the search data sr of "1" does not match the stored data st of "0" and the mismatch-number N(sr0, st1) for which the search data sr of "0" does not match the stored data st of "1", both value is relatively low. The current value of the total current I1*t* reflected by the output signal of the sensing amplifier SA1 is inversely related to the sum of the mismatch-number N(sr1, st0) and the mismatch-number N(sr0,st1).

On the other hand, for the second memory string 2*a* of the memory block 20*a*, its string output current I2*a* is analogously summed to the string output current I2*b* of the corresponding memory string 2*b* of another memory block 20*b*, so as to obtain the total current I2*t*. The sensing amplifier SA2 is used to sense the total current I2*t*, so as to analyze the IMS comparison result of the memory string 2*a* and the memory string 2*b*.

Similarly, the string output current I3*a* of the third memory string 3*a* is analogously summed to the string output current I3*b* of the memory string 3*b*, so as to obtain the total current I3*t*. The total current I3*t* is sensed by the sensing amplifier SA3 to analyze the IMS comparison result of the memory string 3*a* and the memory string 3*b*.

Figure 7:
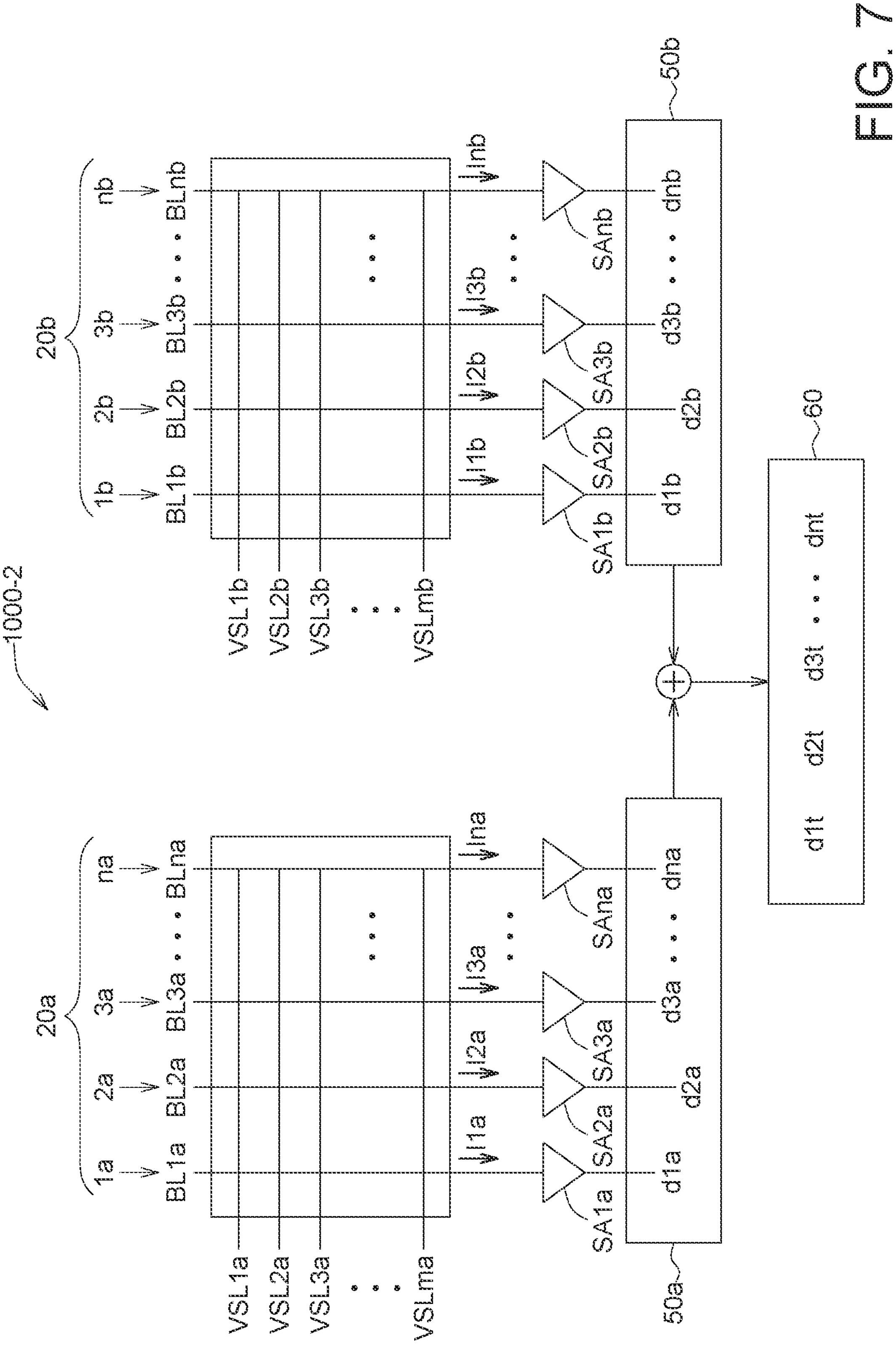
FIG. 7 is a schematic diagram of a memory device according to still another embodiment of the present disclosure.

FIG. 7 is a schematic diagram of a memory device 1000-2 according to still another embodiment of the present disclosure. In the memory device 1000-2 of this embodiment, the comparison result of IMS is analyzed based on the string output current of the memory block 20*a* and the memory block 20*b*, in a manner of "digital sensing". As shown in FIG. 7, the memory device 1000 further includes a register 50*a*, a register 50*b* and a register 60, all these registers are digital. The string output currents I1*a*, 12*a*, . . . , In a generated by the memory strings 1*a*, 2*a*, . . . , na are sent to the sensing amplifiers SA1*a*, SA2*a*, . . . , SAna. Furthermore, the sensing amplifiers SA1*a*, SA2*a*, . . . , SAna may set a threshold TH having different levels th1, th2, . . . , thm.

Taking the sensing amplifier SA1*a* as an example, when the current value of the string output current I1*a* corresponds to the level th1 of the threshold TH, this current value reflects that the mismatch-number N(sr1, st0) of the memory string 1*a* is equal to 1, which indicate: the "mismatched-bits-number" d1*a* for the search word sr_w and the stored word st_w of the memory string 1*a* is equal to 1. When the current value of the string output current I1*a* corresponds to the level th2 of the threshold TH, it means that the mismatched-bits-number d1*a* for the search word sr_w and the stored word st_w of the memory string 1*a* is equal to 2, and so on. According to the threshold TH of different levels of the sensing amplifier SA1*a*, the mismatched-bits-number d1*a* of the memory word string 1*a* can be analyzed. Similarly, according to the threshold TH of different levels of the second sensing amplifier SA2*a*, the mismatched-bits-number d2*a* of the second memory word string 2*a* can be analyzed. Moreover, the mismatched-bits-number d1*a*, *d*2*a*, . . . , dna of the memory strings 1*a*, 2*a*, . . . ,na of the memory block 20*a* are stored in the register 50*a* in digital formats.

Similarly, the mismatched-bits-number d1*b*, *d*2*b*, . . . , dnb of the memory strings 1*b*, 2*b*, . . . ,nb of another memory block 20*b* are stored in the register 50*b* in digital formats. Furthermore, the mismatched-bits-numbers of memory strings stored in register 50*a* and register 50*b* are summed up, and the summed result is stored in the register 60. For example, the mismatched-bits-number d1*a* is 2 for the memory string 1*a* of the memory block 20*a*, and the mismatched-bits-number d1*b* is 3 for the memory string 1*b* of the memory block 20*b*. The mismatched-bits-number d1*a* is summed to the mismatched-bits-number d1*b* to obtain a summed result d1*t* of 5. The summed result d1*t* is stored in the register 60.

Similarly, the mismatched-bits-number d2*a* is 5 for the memory string 2*a*, the mismatched-bits-number d2*b* is 0 for the memory string 2*b*. Hence, the summed result d2*t* is 5, and summed result d2*t* is stored in the register 60.

The summed results d1*t*, *d*2*t*, . . . , dnt stored in the register 60 indicate the Hamming distance HD for the search word sr_w and the stored word st_w for the memory strings 1*b*, 2*b*, . . . , nb.

In view of the above, the memory device 1000 of the present disclosure is equipped with SLCs, which may less suffer data reading errors, and thus has better reliability. Moreover, the length of the search word sr_w that the memory device 1000 can process is relatively long. Furthermore, the memory device 1000 of the present disclosure can process IMS operation of entire memory block in one read operation, which has the effect of highly parallel processing.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device for performing in-memory-search for a search word including a plurality of bits, the memory device comprising:

a plurality of first signal lines, each of which is used to input a search data which is one of the bits of the search word and is applied with a search voltage corresponding to the search data;

a plurality of second signal lines, each of which is used to generate an output current; and a plurality of memory cells, each of which is coupled to one of the first signal lines and one of the second signal lines, disposed in one of a plurality of layers of the memory device, and used to store a stored data corresponding to a threshold voltage of the memory cell and process one of the bits of the search word wherein the stored data is compared with the search data corresponding to the bit of the search word to obtain a comparison result related to the output current wherein, the memory cells include a plurality of first memory cells and a plurality of second memory cells, when the stored data of the first memory cells has the same value as the stored data of the second memory cells, the threshold voltage of the first memory cells is different from the threshold voltage of the second memory cells, and when the search data of the first memory cells has the same value as the search data of the second memory cells, the search voltage applied to the first memory cells is different from the search voltage applied to the second memory cells.

2. The memory device according to claim 1, wherein, the threshold voltage of the first memory cells is a first threshold voltage or a second threshold voltage, the first threshold voltage corresponds to the stored data of "1", the second threshold voltage corresponds to the stored data of "0", and the second threshold voltage is higher than the first threshold voltage.

3. The memory device according to claim 2, wherein, when the threshold voltage of the first memory cells is one of the first threshold voltage and the second threshold voltage, the threshold voltage of the second memory cells is the other one of the first threshold voltage and the second threshold voltage.

4. The memory device according to claim 2, wherein, the applied search voltage of the first memory cells is a first search voltage or a second search voltage, the first search voltage corresponds to the stored data of "1", the second search voltage corresponds to the stored data of "0", and the second search voltage is higher than the first search voltage.

5. The memory device according to claim 4, wherein, when the applied search voltage of the first memory cells is one of the first search voltage and the second search voltage, the applied search voltage of the second memory cells is the other one of the first search voltage and the second search voltage.

6. The memory device according to claim 4, wherein, the first search voltage is higher than the second threshold voltage.

7. The memory device according to claim 4, wherein:

when the stored data of the first memory cells is "0" and the search data is "1", the comparison result is "mismatch", and the output current has a first current value; and when the stored data of the second memory cells is "1" and the search data is "0", the comparison result is "mismatch", and the output current has the first current value.

8. The memory device according to claim 7, wherein, when the stored data of the first memory cells or the second memory cells is "1" and the search data is "1", or when the stored data is "0" and the search data is "0", the comparison result is "match", and the output current has a second current value, the second current value is higher than the first current value.

9. The memory device according to claim 7, wherein:

the first memory cells coupled to a same one of the second signal lines form a first memory string, and the first memory string generates a first string output current;

the second memory cells coupled to a same one of the second signal lines form a second memory string, and the second memory string generates a second string output current; and the number for the comparison result being "mismatch" is inversely related to a sum of the first string output current and the second string output current.

10. The memory device according to claim 1, further comprising:

a plurality of sensing amplifiers, correspondingly coupled to the second signal lines;

wherein, the sensing amplifiers are used to sense the output current to reflect the comparison result.

11. An operating method of a memory device for performing in-memory-search for a search word including a plurality of bits, the memory device comprises a plurality of first signal lines each of which is used to input a search data which is one of the bits of the search word, a plurality of second signal lines each of which is used to generate an output current, and a plurality of memory cells each of which is coupled to one of the first signal lines and one of the second signal lines, disposed in one of a plurality of layers of the memory device, and used to store a stored data corresponding to a threshold voltage of the memory cell, the operating method comprising:

applying a search voltage corresponding to the search data through each of the first signal lines;

processing one of the bits of the search word by each of the memory cells, wherein the stored data is compared with the search data corresponding to the bit of the search word to obtain a comparison result; and generating the output current through each of the second signal lines, wherein the output current is related to the comparison result, wherein, the memory cells include a plurality of first memory cells and a plurality of second memory cells, when the stored data of the first memory cells has the same value as the stored data of the second memory cells, the threshold voltage of the first memory cells is different from the threshold voltage of the second memory cells, and when the search data of the first memory cells has the same value as the search data of the second memory cells, the search voltage applied to the first memory cells is different from the search voltage applied to the second memory cells.

12. The operating method according to claim 11, wherein, the threshold voltage of the first memory cells is a first threshold voltage or a second threshold voltage, the first threshold voltage corresponds to the stored data of "1", the second threshold voltage corresponds to the stored data of "0", and the second threshold voltage is higher than the first threshold voltage.

13. The operating method according to claim 12, wherein, when the threshold voltage of the first memory cells is one of the first threshold voltage and the second threshold voltage, the threshold voltage of the second memory cells is the other one of the first threshold voltage and the second threshold voltage.

14. The operating method according to claim 12, wherein, the applied search voltage of the first memory cells is a first search voltage or a second search voltage, the first search voltage corresponds to the stored data of "1", the second search voltage corresponds to the stored data of "0", and the second search voltage is higher than the first search voltage.

15. The operating method according to claim 14, wherein, when the applied search voltage of the first memory cells is one of the first search voltage and the second search voltage, the applied search voltage of the second memory cells is the other one of the first search voltage and the second search voltage.

16. The operating method according to claim 14, wherein, the first search voltage is higher than the second threshold voltage.

17. The operating method according to claim 14, wherein:

when the stored data of the first memory cells is "0" and the search data is "1", the comparison result is "mismatch", and the output current has a first current value; and when the stored data of the second memory cells is "1" and the search data is "0", the comparison result is "mismatch", and the output current has the first current value.

18. The operating method according to claim 17, wherein, when the stored data of the first memory cells or the second memory cells is "1" and the search data is "1", or when the stored data is "0" and the search data is "0", the comparison result is "match", and the output current has a second current value, the second current value is higher than the first current value.

19. The operating method according to claim 17, wherein, the first memory cells coupled to a same one of the second signal lines form a first memory string, the second memory cells coupled to a same one of the second signal lines form a second memory string, and the operating method further comprising:

generating a first string output current through the first memory string; and generating a second string output current through the second memory string, wherein, the number for the comparison result being "mismatch" is inversely related to a sum of the first string output current and the second string output current.

20. The operating method according to claim 11, wherein, the memory device further comprises a plurality of sensing amplifiers, the sensing amplifiers are correspondingly coupled to the second signal lines, and the operating method further comprising:

sensing the output current through the sensing amplifiers to reflect the comparison result.

* * * * *